(12) United States Patent
Scott et al.

(10) Patent No.: US 10,333,479 B2
(45) Date of Patent: Jun. 25, 2019

(54) POWER AMPLIFIER WITH IMPROVED LINEARITY

(71) Applicant: Qorvo US, Inc., Greensboro, NC (US)

(72) Inventors: Baker Scott, San Jose, CA (US);
George Maxim, Saratoga, CA (US);
Dirk Robert Walter Leipold, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/845,083

(22) Filed: Dec. 18, 2017

(65) Prior Publication Data

US 2018/0175813 A1 Jun. 21, 2018

Related U.S. Application Data

(60) Provisional application No. 62/435,367, filed on Dec. 16, 2016.

(51) Int. Cl.

| | |
|---|---|
| *H03F 3/191* | (2006.01) |
| *H03F 3/45* | (2006.01) |
| *G05F 1/575* | (2006.01) |
| *H02M 1/44* | (2007.01) |
| *G05F 1/56* | (2006.01) |
| *H03F 1/08* | (2006.01) |
| *H03F 1/02* | (2006.01) |
| *H02M 3/156* | (2006.01) |
| *H03F 1/32* | (2006.01) |
| *H03F 3/195* | (2006.01) |
| *H03F 3/21* | (2006.01) |

(52) U.S. Cl.
CPC ......... *H03F 3/45475* (2013.01); *G05F 1/562* (2013.01); *G05F 1/575* (2013.01); *H02M 1/44* (2013.01); *H02M 3/156* (2013.01); *H03F 1/02* (2013.01); *H03F 1/0222* (2013.01); *H03F 1/08* (2013.01); *H03F 1/083* (2013.01); *H03F 1/3211* (2013.01); *H03F 3/195* (2013.01); *H03F 3/211* (2013.01); *H03F 3/4508* (2013.01); *H03F 2200/102* (2013.01); *H03F 2200/451* (2013.01); *H03F 2203/45394* (2013.01)

(58) Field of Classification Search
CPC ........ H03F 1/14; H03F 1/0222; H03F 1/0233; H03F 3/191
USPC ......................................... 330/136, 292, 305
See application file for complete search history.

(56) References Cited

U.S. PATENT DOCUMENTS

| | | | | |
|---|---|---|---|---|
| 6,160,452 | A * | 12/2000 | Daughtry | H04N 7/102 330/277 |
| 8,792,836 | B2 * | 7/2014 | Mikhemar | H04B 1/0458 455/78 |
| 2011/0298535 | A1 * | 12/2011 | Van Rijs | H03F 1/0222 330/53 |

\* cited by examiner

*Primary Examiner* — Steven J Mottola
(74) *Attorney, Agent, or Firm* — Withrow & Terranova, P.L.L.C.

(57) ABSTRACT

Power amplifier circuitry includes an amplifier stage, a non-linear compensation network, and non-linear compensation control circuitry. The amplifier stage includes an input and an output, and is configured to receive an input signal at the input and provide an amplified output signal at the output. The non-linear compensation network is coupled between the input and the output of the amplifier stage. The non-linear compensation control circuitry is coupled to the non-linear compensation network and one or more of the input and the output of the amplifier stage. The non-linear compensation control circuitry is configured to adjust a capacitance of the non-linear compensation network to cancel a parasitic capacitance associated with the amplifier stage and thus reduce AM-PM distortion.

21 Claims, 10 Drawing Sheets

POWER AMPLIFIER WITH IMPROVED LINEARITY

RELATED APPLICATIONS

This application claims the benefit of provisional patent application Ser. No. 62/435,367, filed Dec. 16, 2016, the disclosure of which is hereby incorporated herein by reference in its entirety.

FIELD OF THE DISCLOSURE

The present disclosure relates to power amplifiers, and in particular to power amplifiers and supporting circuitry configured to increase the linearity thereof.

BACKGROUND

Power amplifiers are an essential component of modern wireless communications devices. Specifically, power amplifiers are often used to amplify wireless signals for transmission from one or more antennas. To maintain the fidelity of wireless signals, it is generally desirable for power amplifiers to be as linear as possible. However, conventional power amplifiers often suffer from significant non-linear behavior (e.g., AM-PM distortion) due to parasitic capacitances therein. Solutions to this problem have proposed coupling fixed compensation capacitors to power amplifiers to cancel the aforementioned parasitic capacitances. While such an approach may improve linearity at small signal levels, it often further degrades linearity at large signal levels where these parasitic capacitances may exhibit significant non-linear behavior. Accordingly, there is a need for power amplifiers with improved linearity at both small and large signal levels.

SUMMARY

In one embodiment, power amplifier circuitry includes an amplifier stage, a non-linear compensation network, and non-linear compensation control circuitry. The amplifier stage includes an input and an output, and is configured to receive an input signal at the input and provide an amplified output signal at the output. The non-linear compensation network is coupled between the input and the output of the amplifier stage. The non-linear compensation control circuitry is coupled to the non-linear compensation network and one or more of the input and the output of the amplifier stage. The non-linear compensation control circuitry is configured to adjust a capacitance of the non-linear compensation network to cancel a parasitic capacitance associated with the amplifier stage and thus reduce AM-PM distortion. By using the non-linear compensation control circuitry to adjust the capacitance of the non-linear compensation network, AM-PM distortion of the amplifier stage may be significantly reduced, thereby improving the performance of the power amplifier circuitry.

In one embodiment, the power amplifier circuitry further includes compensation network protection circuitry coupled to the non-linear compensation network and configured to clamp a voltage across one or more varactors in the non-linear compensation network below a threshold value. By clamping the voltage across the one or more varactors in the non-linear compensation network with the compensation network protection circuitry, failure of the varactors due to overvoltage conditions can be prevented.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 1A, 1B, 1C, and 1D are functional schematics illustrating power amplifier circuitry according to one embodiment of the present disclosure.

FIGS. 2A, 2B, and 2C are functional schematics illustrating power amplifier circuitry according to one embodiment of the present disclosure.

DETAILED DESCRIPTION

Figure 1A:
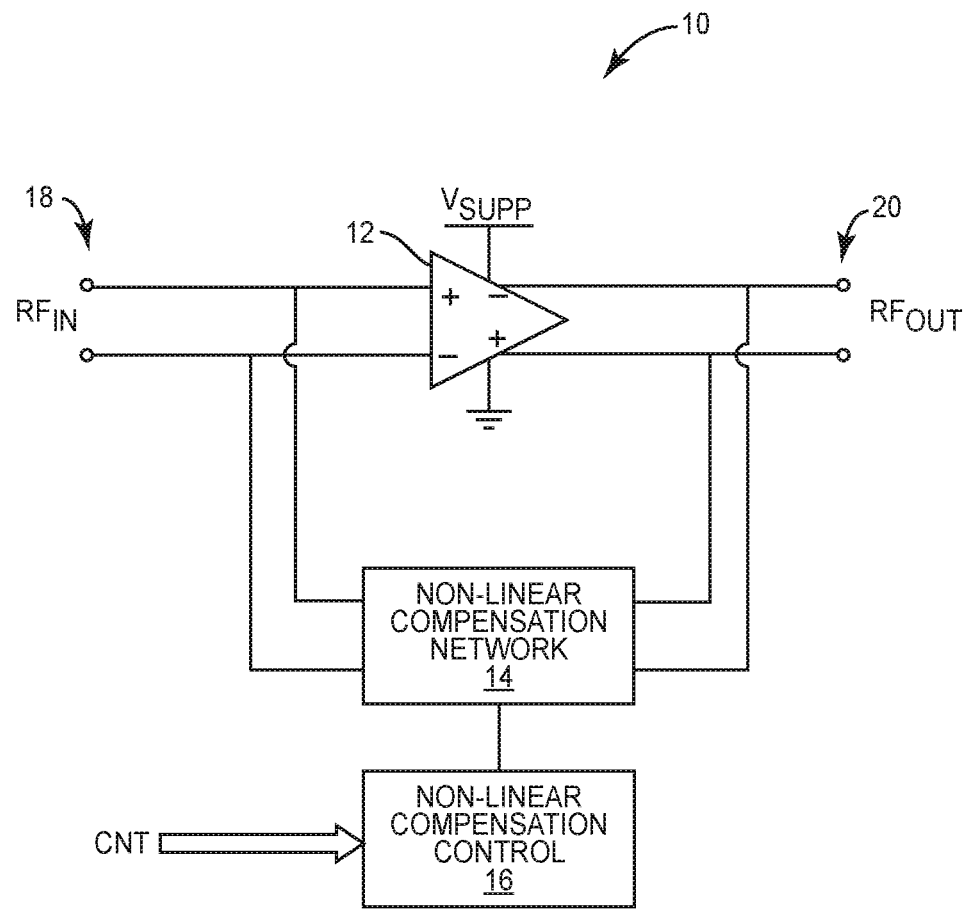

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1A is a functional schematic illustrating power amplifier circuitry 10 according to one embodiment of the present disclosure. The power amplifier circuitry 10 includes an amplifier stage 12, a non-linear compensation network 14, and non-linear compensation control circuitry 16. The amplifier stage 12 is a differential amplifier stage including a differential input 18 and a differential output 20. The amplifier stage 12 is configured to receive a differential RF input signal $RF_{IN}$ at the differential input 18, amplify the RF input signal $RF_{IN}$ using a supply voltage $V_{SUPP}$, and provide an amplified RF output signal $RF_{OUT}$ at the differential output 20. The non-linear compensation network 14 is cross-coupled between the differential input 18 and the differential output 20 as discussed in detail in the coming figures. The non-linear compensation control circuitry 16 is coupled to the non-linear compensation network 14 and configured to control one or more characteristics thereof. In one embodiment, the non-linear compensation network 14 includes one or more varactors. In such an embodiment, the non-linear compensation control circuitry 16 may be configured to adjust a capacitance presented by the non-linear compensation network 14 to the differential input 18 and the differential output 20 in order to cancel a parasitic capacitance associated with the amplifier stage 12 and thus decrease AM-PM distortion at the differential output 20. The non-linear compensation control circuitry 16 may control the one or more characteristics of the non-linear compensation network 14 based on a control signal CNT received via a signal bus as shown.

As discussed above, the amplifier stage 12 is associated with one or more parasitic capacitances, which present themselves across the differential input 18 and the differential output 20. These parasitic capacitances often cause non-linear behavior in the form of AM-PM distortion. Conventional approaches to mitigating this problem involve coupling fixed capacitances across the differential input 18 and the differential output 20. Such conventional approaches only increase linearity at small signal levels, and may actually further increase AM-PM distortion when compared to uncompensated amplifier stages at large signal levels. This is due to the fact that the parasitic capacitances associated with the amplifier stage 12 exhibit non-linear capacitances with respect to signal level. In contrast to the conventional approaches, the non-linear compensation network 14 may be adjusted by the non-linear compensation control circuitry 16 based on the signal level and other parameters in order to cancel the parasitic capacitances associated with the amplifier stage 12. Specifically, the non-linear compensation control circuitry 16 may adjust one or more parameters of the non-linear compensation network 14 according to an inverse non-linear function roughly matching the parasitic capacitance associated with the amplifier stage 12 in order to cancel the parasitic capacitance and thus significantly reduce AM-PM distortion in the amplifier stage 12. In one embodiment, the non-linear compensation control circuitry 16 adjusts one or more parameters of the non-linear compensation network 14 to remain relatively constant in the small signal regime and adjusts the one or more parameters of the non-linear compensation network 14 according to a non-linear function in the large signal regime.

Figure 1B:
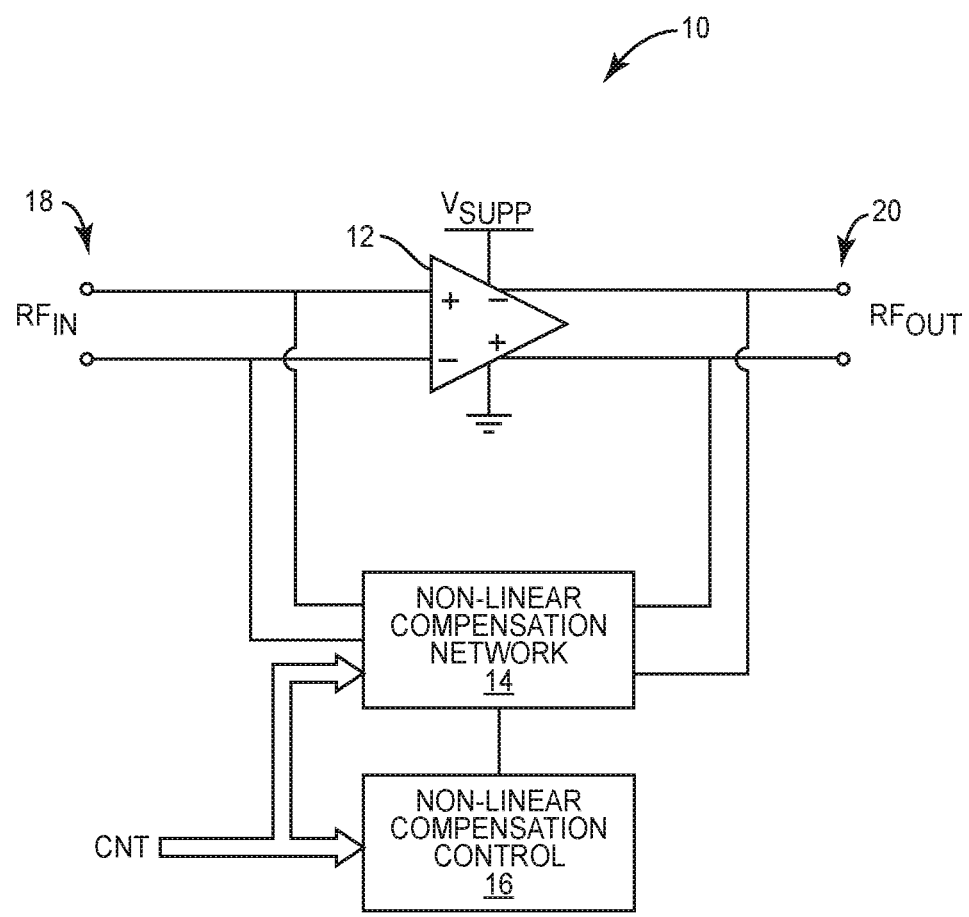

FIG. 1B is a functional schematic illustrating the power amplifier circuitry 10 according to an additional embodiment of the present disclosure. The power amplifier circuitry 10 shown in FIG. 1B is substantially similar to that shown in FIG. 1A, except that the control signal CNT from the signal bus is delivered not only to the non-linear compensation control circuitry 16, but also the non-linear compensation network 14. As discussed above, the non-linear compensation network 14 may include one or more varactors. In such an embodiment, the non-linear compensation control circuitry 16 may be configured to adjust a capacitance presented by the non-linear compensation network 14 to the differential input and the differential output 20. The non-linear compensation control circuitry 16 may do so based on the control signal CNT. In addition to the above, the control signal CNT or a portion thereof may also be used to adjust a size of the varactors in the non-linear compensation network 14, and thus may be delivered directly to the non-linear compensation network in some embodiments as shown in FIG. 1B.

Figure 1C:
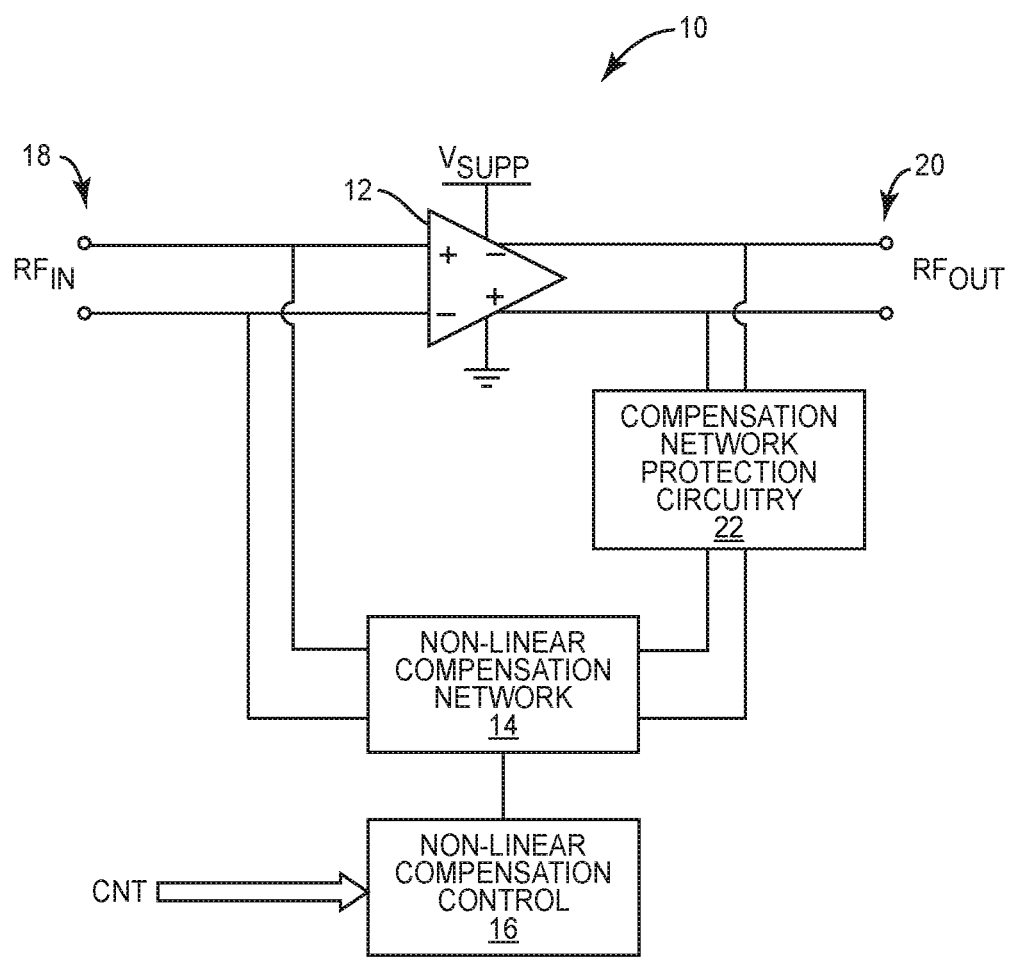

FIG. 1C is a functional schematic illustrating the power amplifier circuitry 10 according to an additional embodiment of the present disclosure. The power amplifier circuitry 10 shown in FIG. 1C is substantially similar to that shown in FIG. 1A, except that the power amplifier circuitry 10 further includes compensation network protection circuitry 22 coupled between the non-linear compensation network 14 and the differential output 20. The compensation network protection circuitry 22 may be configured to clamp a voltage across the non-linear compensation network below a threshold value in order to prevent failure of the components therein, for example, due to an overvoltage condition. Notably, the compensation network protection circuitry 22 may only be required when the components in the non-linear compensation network 14 are not suited for handling large voltages and/or currents.

Figure 1D:
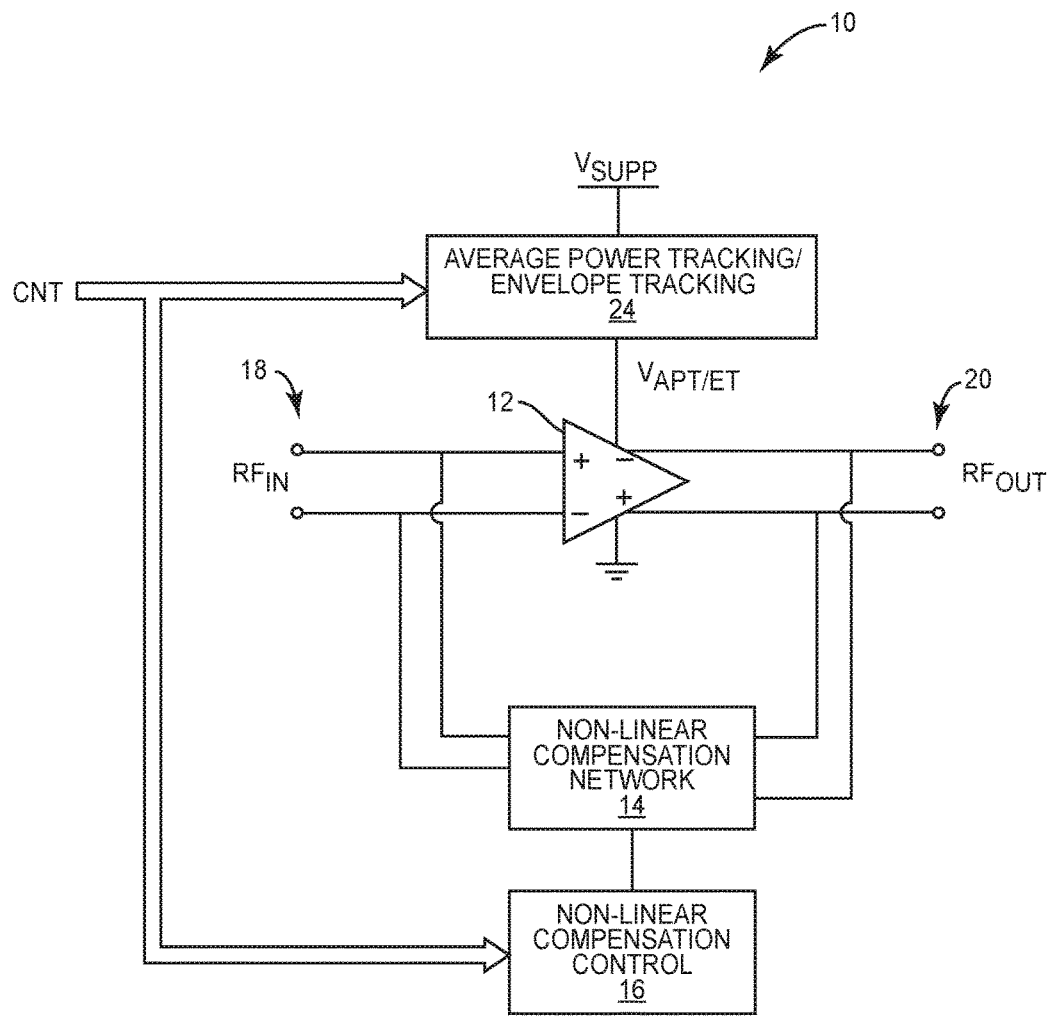

FIG. 1D is a functional schematic illustrating the power amplifier circuitry 10 according to an additional embodiment of the present disclosure. The power amplifier circuitry 10 shown in FIG. 1D is substantially similar to that shown in FIG. 1A, except that the power amplifier circuitry 10 further includes average power tracking and/or envelope tracking power supply circuitry 24 coupled to the amplifier stage 12. As will be appreciated by those skilled in the art, the state of the art power amplifier systems utilize average power tracking, envelope tracking, or both to increase the performance of the power amplifier stages therein. Rather than receiving the supply voltage $V_{SUPP}$ directly, the average power tracking and/or envelope tracking power supply circuitry 24 receives the supply voltage $V_{SUPP}$ and provides one or more of an average power tracking signal and an envelope tracking power supply signal $V_{APT}$/ET to the amplifier stage 12. Notably, the same control signal CNT or different portions thereof are delivered to both the average power tracking and/or envelope tracking power supply circuitry 24 and the non-linear compensation control circuitry 16. This is because the amount of compensation provided by the non-linear compensation control circuitry 16 is dependent on the supply voltage to the amplifier stage 12 and thus should vary accordingly. Accordingly, in the present embodiment the non-linear compensation control circuitry 16 is configured to adjust one or more parameters of the non-linear compensation network 14 based at least in part on the power supply signal provided to the amplifier stage 12, which may be an average power tracking power supply signal and/or an envelope tracking power supply signal.

Figure 2A:
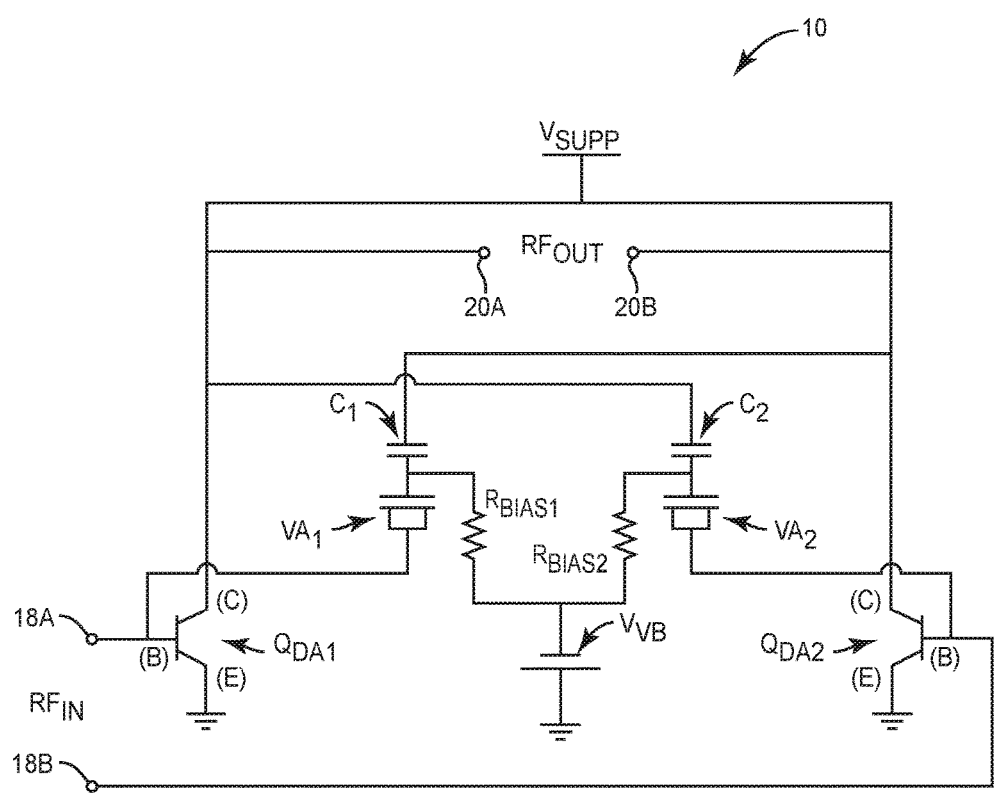

FIG. 2A shows details of the power amplifier circuitry 10 according to one embodiment of the present disclosure. The power amplifier circuitry 10 includes a first differential amplifier element $Q_{DA1}$ and a second differential amplifier element $Q_{DA2}$ coupled between the differential input 18 and the differential output 20. Specifically, a base (B) of the first differential amplifier element $Q_{DA1}$ is coupled to a first differential input node 18A, a collector (C) of the first differential amplifier element $Q_{DA1}$ is coupled to a first differential output node 20A and a supply voltage $V_{SUPP}$, and an emitter (E) of the first differential amplifier element $Q_{DA1}$ is coupled to ground. A base (B) of the second differential amplifier element $Q_{DA2}$ is coupled to a second differential input node 18B, a collector (C) of the second differential amplifier element $Q_{DA2}$ is coupled to a second differential output node 20B and a supply voltage $V_{SUPP}$, and an emitter (E) of the second differential amplifier element $Q_{DA2}$ is coupled to ground. A first varactor $VA_1$ is coupled in series with a first capacitor $C_1$ between the first differential input node 18A and the second differential output node 20B. Similarly, a second varactor $VA_2$ is coupled in series with a second capacitor $C_2$ between the second differential input node 18B and the first differential output node 20A. A varactor bias voltage $V_{VB}$ is coupled to a point between the first varactor $VA_1$ and the first capacitor $C_1$, and between the second varactor $VA_2$ and the second capacitor $C_2$, via a first bias resistor $R_{BIAS1}$ and a second bias resistor $R_{BIAS2}$, respectively.

In the power amplifier circuitry 10 shown in FIG. 2A, the first differential amplifier element $Q_{DA1}$ and the second differential amplifier element $Q_{DA2}$ correspond with the amplifier stage 12, the first varactor $VA_1$ and the second varactor $VA_2$ correspond with the non-linear compensation network 14, the varactor bias voltage $V_{VB}$ corresponds with at least a portion of the non-linear compensation control circuitry 16, and the first capacitor $C_1$ and the second capacitor $C_2$ correspond with the compensation network protection circuitry 22. In operation, the first differential power amplifier element $Q_{DA1}$ and the second differential power amplifier element $Q_{DA2}$ receive a portion of the RF input signal $RF_{IN}$ at the base (B) thereof and amplify the respective portions of the RF input signal $RF_{IN}$ to provide the RF output signal $RF_{OUT}$. As this occurs, the first varactor $VA_1$ and the second varactor $VA_2$ are adjusted (e.g., by adjusting the bias voltage $V_{VB}$) in order to cancel a parasitic capacitance that may be present between the base (B) and the collector (C) of each one of the first differential amplifier element $Q_{DA1}$ and the second differential amplifier element $Q_{DA2}$. The first capacitor $C_1$ and the second capacitor $C_2$ may ensure that a voltage across the first varactor $VA_1$ and the second varactor $VA_2$ is clamped at a threshold value so as to not exceed a voltage handling capability thereof.

Notably, while the first differential amplifier element $Q_{DA1}$ and the second differential amplifier element $Q_{DA2}$ are shown as bipolar transistors in FIG. 2A, the first differential amplifier element $Q_{DA1}$ and the second differential amplifier element $Q_{DA2}$ may be any suitable type of transistor without departing from the principles described herein. Further, the first differential amplifier element $Q_{DA1}$ and the second differential amplifier element $Q_{DA2}$ may comprise any suitable semiconductor materials system. For example, the first differential amplifier element $Q_{DA1}$ and the second differential amplifier element $Q_{DA2}$ may comprise bipolar transistors comprising silicon (Si) silicon germanium (SiGe), gallium arsenide (GaAs), indium phosphide (InP), or the like. Further, the first differential amplifier element $Q_{DA1}$ and the second differential amplifier element $Q_{DA2}$ may comprise metal-oxide semiconductor transistors such as MOSFETs comprising silicon (Si), silicon-on-insulator (SOI), silicon-on-sapphire (SOS), or the like.

The first varactor $VA_1$ and the second varactor $VA_2$ may comprise any suitable type of varactor without departing from the principles of the present disclosure. In one embodiment, the first varactor $VA_1$ and the second varactor $VA_2$ are accumulation varactors, and in particular metal-oxide semiconductor accumulation varactors. In another embodiment, the first varactor $VA_1$ and the second varactor $VA_2$ are inversion varactors, and in particular metal-oxide semiconductor inversion varactors. In yet another embodiment, the first varactor $VA_1$ and the second varactor $VA_2$ are diode varactors. In some embodiments, the first varactor $VA_1$ may be a first type of varactor while the second varactor $VA_2$ may be a different type of varactor, or the first varactor $VA_1$ and the second varactor $VA_2$ may each comprise multiple different types of varactors such as the ones mentioned above.

Figure 2B:
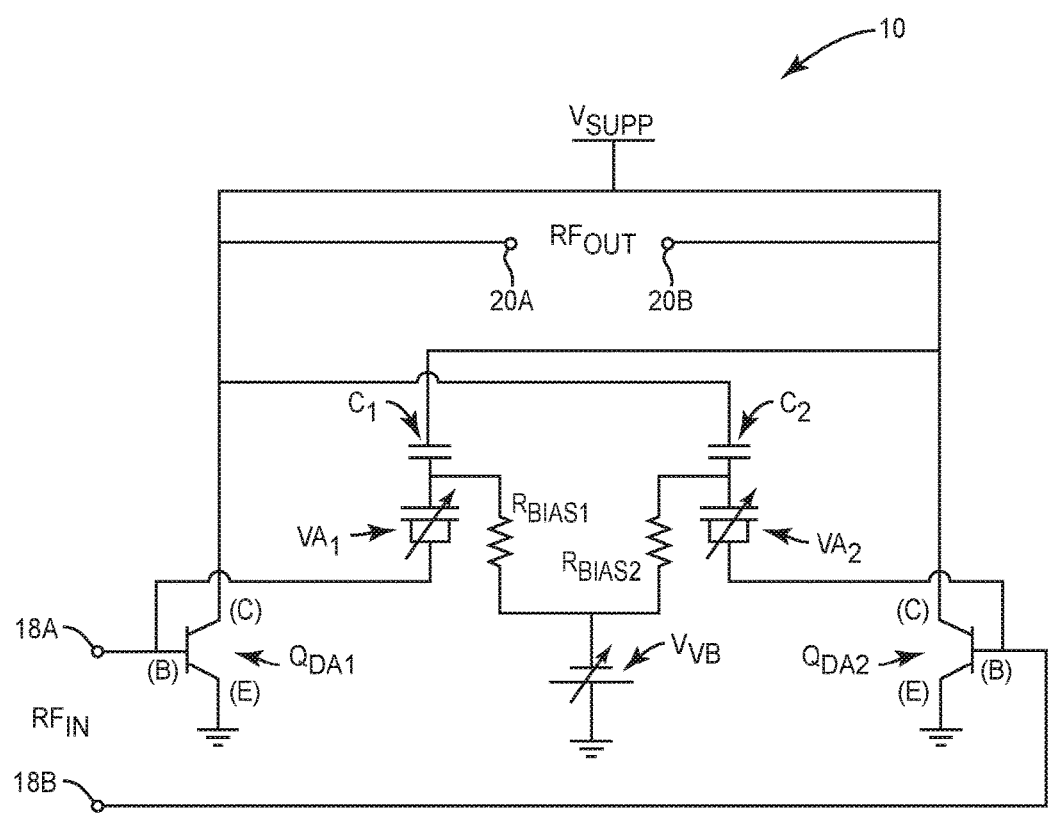
Figure 2C:
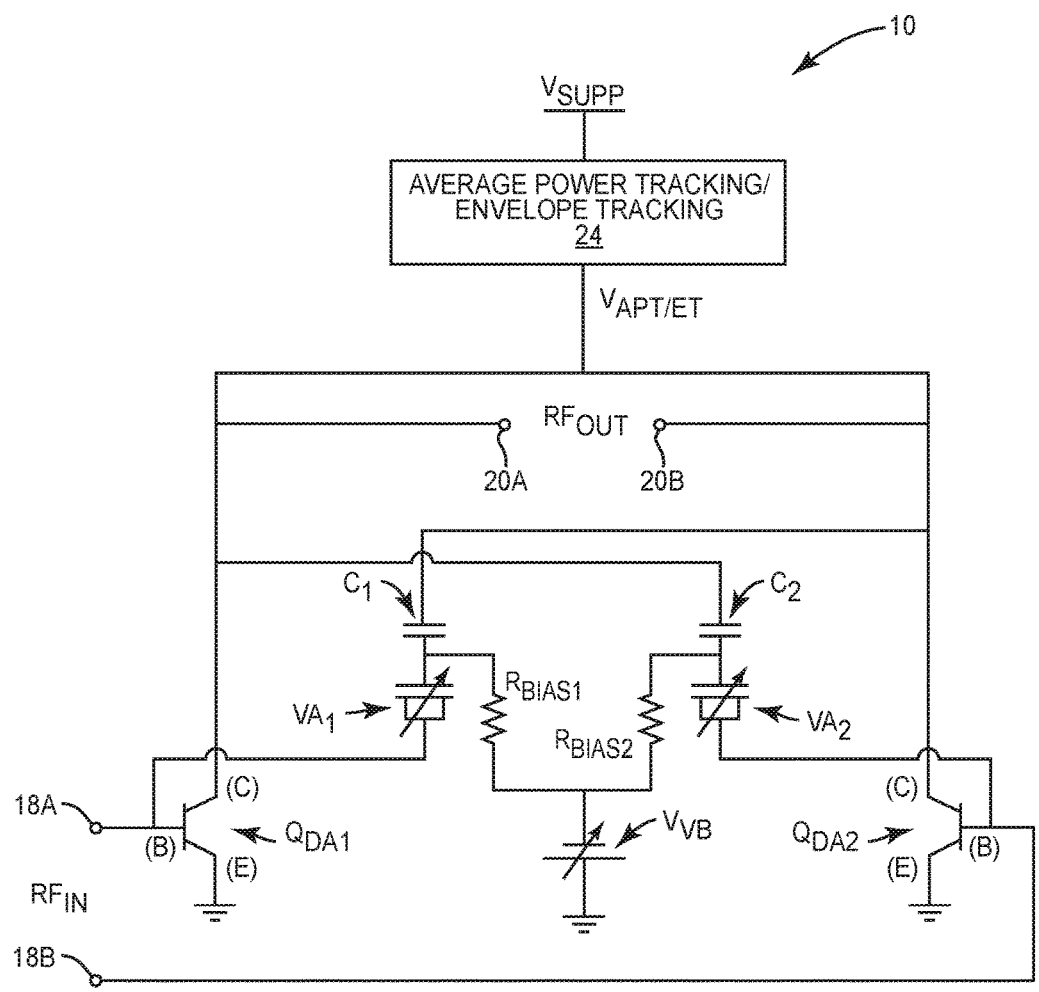

In order to adjust the amount of compensation provided by the first varactor $VA_1$ and the second varactor $VA_2$, the varactor bias voltage $V_{VB}$ may be a variable voltage source as illustrated in FIG. 2B. Further, the first varactor $VA_1$ and the second varactor $VA_2$ may be adjustable in size as shown. While not shown, the adjustment of the varactor bias voltage $V_{VB}$ as well as the size of the first varactor $VA_1$ and the second varactor $VA_2$ may be initiated by a control signal delivered, for example, via a signal bus as discussed above with respect to FIGS. 1A through 1D. As discussed above, the first differential amplifier element $Q_{DA1}$ and the second differential amplifier element $Q_{DA2}$ may be driven by an average power tracking and/or envelope tracking power supply signal, as shown in FIG. 2C. In such an embodiment, the adjustment of the varactor bias voltage $V_{VB}$ and/or the size of the first varactor $VA_1$ and the second varactor $VA_2$ may be coordinated with the average power tracking and/or envelope tracking power supply signal provided to the first differential amplifier element $Q_{DA1}$ and the second differential amplifier element $Q_{DA2}$ such that the compensation provided by the first varactor $VA_1$ and the second varactor $VA_2$ is dependent on the average power tracking signal and/or envelope tracking power supply signal provided to the first differential amplifier element $Q_{DA1}$ and the second differential amplifier element $Q_{DA2}$.

Figure 3A:
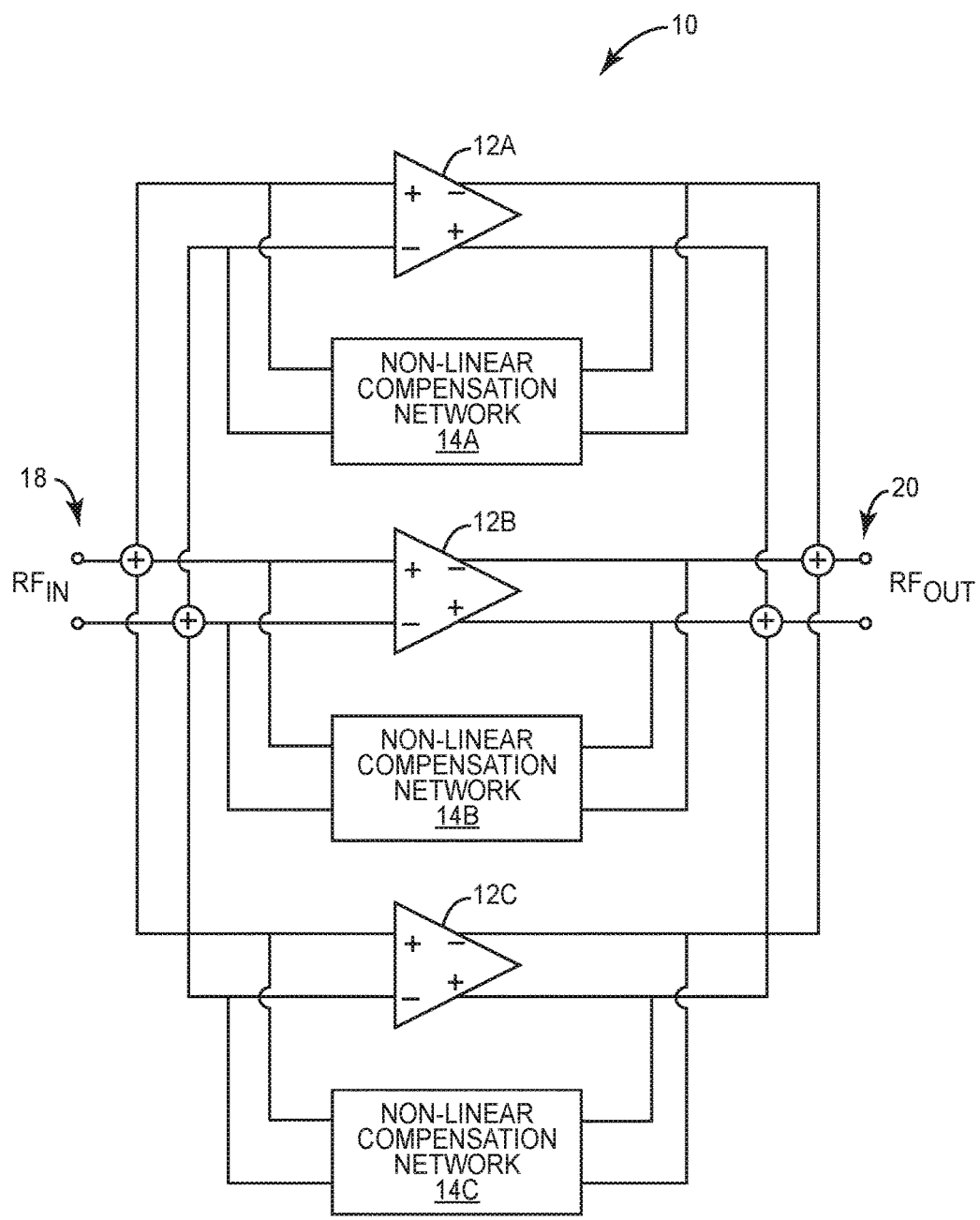
FIGS. 3A and 3B are functional schematics illustrating power amplifier circuitry according to one embodiment of the present disclosure.
Figure 3B:
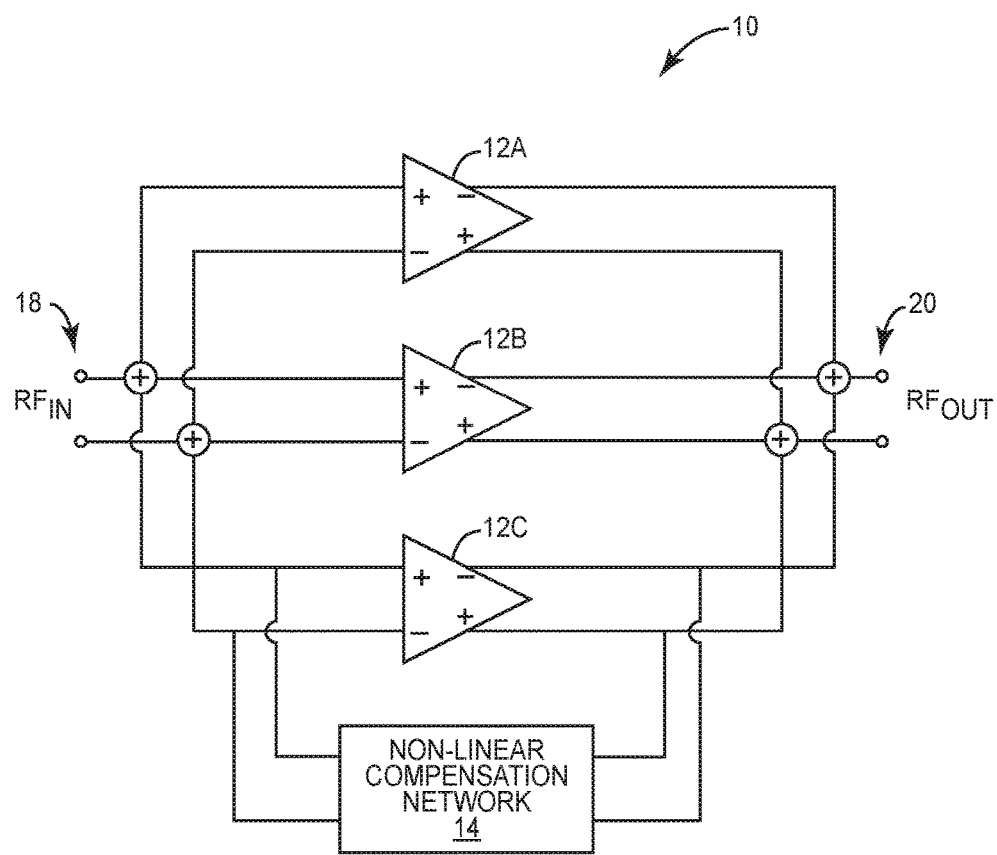

In some embodiments, the power amplifier circuitry 10 may include multiple amplifier stages 12. In such embodiments, each amplifier stage 12 may be coupled with a separate non-linear compensation network 14 as shown in FIG. 3A, wherein each one of three amplifier stages 12 (individually labeled as 12A through 12C) is coupled in parallel with a different non-linear compensation network 14 (individually labeled as 14A through 14C). Each one of the amplifier stages 12 may be coupled together at the differential input 18 and the differential output 20 as shown. Additional details of the power amplifier circuitry 10 mentioned above are not shown to avoid obscuring the drawings, but may similarly be included in the embodiment shown in FIG. 3A. In other embodiments, a single non-linear compensation network 14 may provide compensation for multiple amplifier stages 12 as shown in FIG. 3B. Once again, additional details of the power amplifier circuitry 10 mentioned above are not shown to avoid obscuring the drawings, but may similarly be included in the embodiment shown in FIG. 3A.

Figure 4:
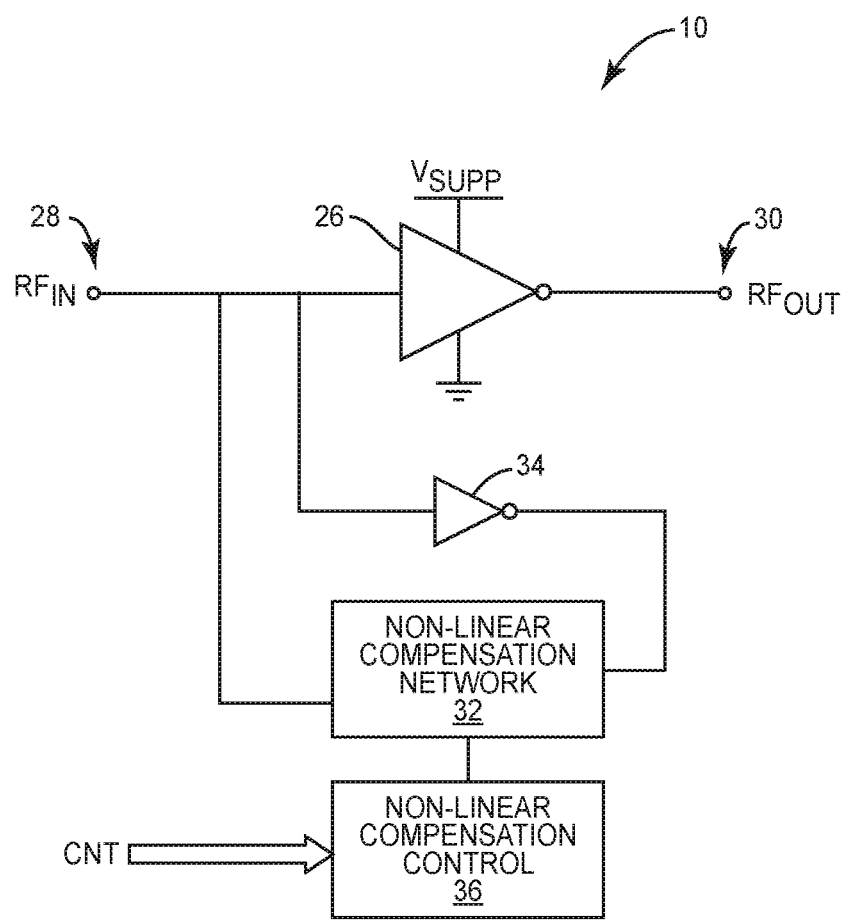
FIG. 4 is a functional schematic illustrating power amplifier circuitry according to one embodiment of the present disclosure.

While the foregoing examples are focused primarily on differential amplifiers, the principles of the present disclosure may similarly be applied to single-ended amplifiers, as illustrated in FIG. 4, which shows the power amplifier circuitry 10 according to an additional embodiment of the present disclosure. The power amplifier circuitry 10 includes a single-ended amplifier stage 26 coupled between a single-ended input 28 and a single-ended output 30. A non-linear compensation network 32 is coupled in series with an auxiliary amplifier 34 in a loop that connects between a first point and a second point of the single-ended input 28. Non-linear compensation control circuitry 36 is coupled to the non-linear compensation network 32 as discussed above. The non-linear compensation network 32 behaves in a similar way to that described above, except that it is not cross-coupled between a differential input and a differential output. Rather than cancelling a parasitic capacitance across the amplifier, the non-linear compensation network 32 performs the same function by changing an input capacitance of the single-ended amplifier stage 26. The non-linear compensation control circuitry 36 may change one or more operating parameters of the non-linear compensation network 32 in order to cancel the parasitic capacitance of the single-ended amplifier stage 26 for both small and large signals, thereby significantly reducing AM-PM distortion and thus improving the performance of the power amplifier circuitry 10.

Those skilled in the art will recognize improvements and modifications to the preferred embodiments of the present disclosure. All such improvements and modifications are considered within the scope of the concepts disclosed herein and the claims that follow.

What is claimed is:

1. Power amplifier circuitry comprising:
    an amplifier stage coupled between an input and an output, the amplifier stage configured to receive an input signal at the input and provide an amplified output signal at the output;
    a non-linear compensation network coupled between the input and the output, and parallel with the amplifier stage; and
    non-linear compensation control circuitry coupled to the non-linear compensation network and configured to adjust a capacitance of the non-linear compensation network according to a non-linear function to cancel a parasitic capacitance associated with the amplifier stage.

2. Power amplifier circuitry comprising:
    an amplifier stage coupled between an input and an output, the amplifier stage configured to receive an input signal at the input and provide an amplified output signal at the output;
    a non-linear compensation network coupled between the input and the output; and
    non-linear compensation control circuitry coupled to the non-linear compensation network and configured to adjust a capacitance of the non-linear compensation network according to a non-linear function to cancel a parasitic capacitance associated with the amplifier stage; and
    compensation network protection circuitry coupled to the non-linear compensation network and configured to clamp a voltage across the non-linear compensation network below a threshold value.

3. The power amplifier circuitry of claim 2 wherein the non-linear compensation control circuitry comprises at least one varactor.

4. The power amplifier circuitry of claim 3 wherein the non-linear compensation control circuitry comprises an adjustable bias voltage coupled to the at least one varactor and configured to adjust a capacitance presented by the at least one varactor.

5. The power amplifier circuitry of claim 4 wherein the compensation network protection circuitry comprises at least one capacitor coupled in series with the at least one varactor.

6. The power amplifier circuitry of claim 1 wherein the non-linear compensation control circuitry comprises at least one varactor.

7. The power amplifier circuitry of claim 6 wherein the non-linear compensation control circuitry comprises an adjustable bias voltage coupled to the at least one varactor and configured to adjust a capacitance presented by the at least one varactor.

8. The power amplifier circuitry of claim 1 further comprising envelope tracking power supply circuitry coupled to the amplifier stage and configured to provide an envelope tracking power supply signal to the amplifier stage.

9. The power amplifier circuitry of claim 8 wherein the non-linear compensation control circuitry is configured to adjust the capacitance of the non-linear compensation network based at least in part on the envelope tracking power supply signal.

10. The power amplifier circuitry of claim 1 wherein:
    the amplifier stage is a differential amplifier stage;
    the input is a differential input comprising a first differential input node and a second differential input node; and
    the output is a differential output comprising a first differential output node and a second differential output node.

11. The power amplifier circuitry of claim 10 wherein the non-linear compensation network comprises:
    a first varactor coupled between the first differential input node and the second differential output node; and
    a second varactor coupled between the second differential input node and the first differential output node.

12. The power amplifier circuitry of claim 11 wherein the differential amplifier stage comprises:
    a first differential amplifier element coupled between the first differential input node and the first differential output node; and a second differential amplifier element coupled between the second differential input node and the second differential output node.

13. The power amplifier circuitry of claim 12 wherein the first differential amplifier element and the second differential amplifier element are bipolar transistors comprising a base, a collector, and an emitter such that:
   a base of the first differential amplifier element is coupled to the first differential input node, a collector of the first differential amplifier element is coupled to the first differential output node, and an emitter of the first differential amplifier element is coupled to a fixed potential; and
   a base of the second differential amplifier element is coupled to the second differential input node, a collector of the second differential amplifier element is coupled to the second differential output node, and an emitter of the second differential amplifier element is coupled to the fixed potential.

14. The power amplifier circuitry of claim 13 further comprising:
   a first capacitor coupled between the first varactor and the second differential output node; and
   a second capacitor coupled between the second varactor and the first differential output node.

15. The power amplifier circuitry of claim 14 further comprising a varactor bias voltage source configured to provide a varactor bias voltage to the first varactor and the second varactor in order to change a capacitance thereof.

16. The power amplifier circuitry of claim 15 further comprising envelope tracking power supply circuitry coupled to a collector of each one of the first differential amplifier element and the second differential amplifier element, the envelope tracking power supply circuitry configured to provide an envelope tracking power supply signal to the first differential amplifier element and the second differential amplifier element.

17. The power amplifier circuitry of claim 16 wherein the varactor bias voltage provided by the varactor bias voltage source is at least partially dependent on the envelope tracking power supply signal.

18. The power amplifier circuitry of claim 11 further comprising:
   a first capacitor coupled between the first varactor and the second differential output node; and
   a second capacitor coupled between the second varactor and the first differential output node.

19. The power amplifier circuitry of claim 11 further comprising a varactor bias voltage source configured to provide a varactor bias voltage to the first varactor and the second varactor in order to change a capacitance thereof.

20. The power amplifier circuitry of claim 19 further comprising envelope tracking power supply circuitry configured to provide an envelope tracking power supply signal to the amplifier stage.

21. The power amplifier circuitry of claim 20 wherein the varactor bias voltage provided by the varactor bias voltage source is at least partially dependent on the envelope tracking power supply signal.

* * * * *